(12) United States Patent
Stein et al.

(10) Patent No.: US 11,791,928 B2
(45) Date of Patent: Oct. 17, 2023

(54) DIGITAL DATA RATE ENHANCEMENT FILTER, DIGITAL DATA RATE REDUCTION FILTER, AND DIGITAL OSCILLOSCOPE

(71) Applicant: Rohde & Schwarz GmbH & Co. KG, Munich (DE)

(72) Inventors: Manuel Stein, Munich (DE); Julian Leyh, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 102 days.

(21) Appl. No.: 17/494,579

(22) Filed: Oct. 5, 2021

(65) Prior Publication Data
US 2023/0105455 A1   Apr. 6, 2023

(51) Int. Cl.
*H04L 1/00*   (2006.01)
*G01R 13/02*   (2006.01)

(52) U.S. Cl.
CPC ........ *H04L 1/0002* (2013.01); *G01R 13/0272* (2013.01)

(58) Field of Classification Search
CPC ............ G01R 13/0272; G01R 19/2509; G01R 13/0236; H04L 1/0002
See application file for complete search history.

(56) References Cited

U.S. PATENT DOCUMENTS

| | | | | |
|---|---|---|---|---|
| 2011/0276284 | A1* | 11/2011 | Johansson | H03M 1/0626 702/58 |
| 2014/0029680 | A1* | 1/2014 | Ray | H04L 27/0008 375/259 |
| 2020/0412342 | A1* | 12/2020 | Haberstroh | G01R 13/0254 |

* cited by examiner

*Primary Examiner* — Son T Le
*Assistant Examiner* — Adam S Clarke
(74) *Attorney, Agent, or Firm* — CHRISTENSEN O'CONNOR JOHNSON KINDNESS PLLC

(57) ABSTRACT

A digital data rate enhancement filter is described. The digital data rate enhancement filter-includes an enhancement filter input, a first interpolation filter, a second interpolation filter, and a multiplexer circuit. The first interpolation filter is connected to the enhancement filter input downstream of the enhancement filter input. The second interpolation filter is connected to the first interpolation filter downstream of the first interpolation filter. The enhancement filter input is configured to receive a digital input signal set. The first interpolation filter is configured to receive the digital input signal set and to interpolate the digital input signal set, thereby obtaining a first interpolated signal set. The second interpolation filter is configured to receive the first interpolated signal set and to interpolate the first interpolated signal set, thereby obtaining a second interpolated signal set. The multiplexer circuit is configured to selectively receive the first interpolated signal set and/or the second interpolated signal set. The multiplexer circuit further is configured to output the first interpolated signal set and/or the second interpolated signal set received. Further, a digital data rate reduction filter and a digital oscilloscope are described.

21 Claims, 2 Drawing Sheets

DIGITAL DATA RATE ENHANCEMENT FILTER, DIGITAL DATA RATE REDUCTION FILTER, AND DIGITAL OSCILLOSCOPE

FIELD OF THE DISCLOSURE

Embodiments of the present disclosure generally relate to digital data rate enhancement filter. Embodiments of the present disclosure further relate to a digital data rate reduction filter and a digital oscilloscope.

BACKGROUND

Digital oscilloscopes usually comprise an acquisition circuit that is configured to acquire a signal to be analyzed, a memory circuit that is configured to save samples associated with the signal to be analyzed, and a trigger circuit that is configured to detect predefined events in the signal to be analyzed.

Usually, the digital oscilloscope comprises two or more inputs, such that two or more signals can be analyzed simultaneously. In other words, the digital oscilloscope usually comprises two or more signal channels.

Typically, the number of channels is equal for the acquisition circuit, the memory circuit and the trigger circuit, wherein the number of channels is coupled with a predefined sample rate, i.e., a predefined temporal resolution. In other words, a fixed number of channels is processed with a predefined temporal resolution in each of the circuits.

However, for certain applications it would be desirable to adapt the number of channels and/or the temporal resolution only for a particular sub-circuit of the digital oscilloscope.

Accordingly, there is a need for a digital oscilloscope that has an enhanced flexibility for setting the number of channels and/or the temporal resolution of individual sub-circuits of the digital oscilloscope.

SUMMARY

Embodiments of the present disclosure provide a digital data rate enhancement filter. In an embodiment, the digital data rate enhancement filter comprises an enhancement filter input, a first interpolation filter, a second interpolation filter, and a multiplexer circuit. The first interpolation filter is connected to the enhancement filter input downstream of the enhancement filter input. The second interpolation filter is connected to the first interpolation filter downstream of the first interpolation filter. The enhancement filter input is configured to receive a digital input signal set, wherein the digital input signal set comprises at least one digital input signal. The first interpolation filter is configured to receive the digital input signal set and to interpolate the digital input signal set, thereby obtaining a first interpolated signal set. The second interpolation filter is configured to receive the first interpolated signal set and to interpolate the first interpolated signal set, thereby obtaining a second interpolated signal set. The multiplexer circuit is configured to selectively receive the first interpolated signal set and/or the second interpolated signal set. The multiplexer circuit further is configured to output the first interpolated signal set and/or the second interpolated signal set received.

In the context of the present disclosure, a signal set is understood to denote a single signal or a plurality of signals, wherein the number of signals comprised in the signal set corresponds to the number of channels of the signal set. Accordingly, the terms "interpolate a signal set" or "decimate a signal set" are understood to denote that each signal comprised in the respective signal set is interpolated or decimated.

Due to the interpolation by the first interpolation filter, the first interpolated signal set has an enhanced temporal resolution compared to the digital input signal set. In other words, the data rate associated with the first interpolated signal set is higher than the data rate associated with the digital input signal set, for example by a factor of two.

Likewise, the second interpolated signal set has an enhanced temporal resolution compared to the first interpolated signal set. In other words, the data rate associated with the second interpolated signal set is higher than the data rate associated with the first interpolated signal set, for example by a factor of two.

The multiplexer circuit may selectively receive and output the first interpolated signal set and/or the second interpolated signal set based on requirements of an electronic circuit downstream of the digital data rate enhancement filter. In other words, the multiplexer circuit may be set to receive and output the interpolated signal set that meets the requirements of the electronic circuit downstream of the digital data rate enhancement filter, for example the requirements with respect to temporal resolution.

For example, a trigger circuit of a digital oscilloscope may be connected to the digital data rate enhancement filter downstream of the digital data rate enhancement filter. Thus, the interpolated signal having the appropriate temporal resolution may be outputted by the multiplexer circuit, such that the requirements of the trigger circuit are met.

In some embodiments, the digital data rate enhancement filter increases the temporal resolution, i.e., the data parallelism, such that the trigger circuit downstream of the digital data rate enhancement filter can detect trigger events with a predefined precision.

According to an aspect of the present disclosure, the digital input signal set is a k×j signal, wherein k is a number of channels and j is a data parallelism of the digital input signal set. Thus, k denotes the number of active channels, i.e., the number of signals that are processed in parallel by an electronic component upstream of the digital data rate enhancement filter. Further, j denotes the number of data points per time interval, for example the number of data points per clock cycle. Accordingly, j denotes the number of data points of the respective signal that are processed in parallel (in each channel) by an electronic component upstream of the digital data rate enhancement filter.

In general, k may be a power of 2, i.e., $k=2^{K_{in}}$, with $K_{in}$ being an integer that is greater than or equal to 0. In some embodiments, k may be equal to 1, 2, 4, or 8. However, k may also be an integer greater than 8.

Further, j may be a power of 2, i.e., $j=2^{J_{in}}$, with $J_{in}$ being an integer that is greater than or equal to 0. In some embodiments, j may be equal to 1, 2, 4, 8, 16, 32, 64, or 128. However, j may also be an integer greater than 128.

In some embodiments, the sum of the integers $K_{in}$ and $J_{in}$ may be constant. In other words, $K_{in}$ and $J_{in}$ may be subject to the constraint $K_{in}+J_{in}=C_{in}$, with $C_{in}$ being an integer and being constant.

According to a further aspect of the present disclosure, a digital output signal set outputted by the multiplexer circuit is a l×m signal, wherein l is a number of channels and m is a data parallelism of the digital output signal set. Thus, l denotes the number of active channels, i.e., the number of signals that are processed in parallel by an electronic component downstream of the digital data rate enhancement filter. Further, m denotes the number of data points per time interval, for example the number of data points per clock cycle. Accordingly, m denotes the number of data points of the respective signal that are processed in parallel (in each channel) by an electronic component downstream of the digital data rate enhancement filter.

In general, l may be a power of 2, i.e., $l=2^{L_{out}}$, with $L_{out}$ being an integer that is greater than or equal to 0. In some embodiments, l may be equal to 1, 2, 4, or 8. However, l may also be an integer greater than 8.

Moreover, m may be a power of 2, i.e., $m=2^{M_{out}}$, with $M_{out}$ being an integer that is greater than or equal to 0. In some embodiments, m may be equal to 1, 2, 4, 8, 16, 32, 64, or 128. However, m may also be an integer greater than 128.

In some embodiments, the sum of the integers $L_{out}$ and $M_{out}$ may be constant. In other words, $L_{out}$ and $M_{out}$ may be subject to the constraint $L_{out}+M_{out}=C_{out}$, with $C_{out}$ being an integer and being constant.

In an embodiment of the present disclosure, the digital input signal set is a k×j signal, wherein k is a number of channels and j is a data parallelism of the digital input signal set. A digital output signal set outputted by the multiplexer circuit is a l×m signal, wherein l is a number of channels and m is a data parallelism of the digital output signal set, and wherein l is smaller than k and/or wherein m is greater than j. In other words, the number of channels may be reduced, as the number of output channels l is smaller than the number of input channels k. Alternatively or additionally, the data parallelism of the at least one interpolated signal set outputted by the multiplexer circuit is increased compared to the digital input signal, as the data parallelism j of the digital input signal set is smaller than the data parallelism m of the at least one interpolated signal set outputted by the multiplexer circuit.

If the interpolated signal set outputted by the data rate enhancement filter comprises less channels than required by a downstream electronic component (e.g., a trigger circuit), the digital signals associated with the missing channels may be declared void and/or may be set to a predefined value, for example to 0.

In other words, the number of channels may be reduced in exchange for increased data parallelism, i.e., in exchange for an enhanced temporal resolution.

Accordingly, operational modes of electronic components upstream and downstream of the digital data rate enhancement filter can be chosen independently of each other, as the digital data rate enhancement filter may adapt the number of channels and/or the data parallelism appropriately.

In a further embodiment of the present disclosure, the digital data rate enhancement filter comprises N interpolation filters, wherein N is an integer greater than 2, and wherein the multiplexer circuit is configured to selectively receive at least one interpolated signal set associated with at least one of the interpolation filters. Accordingly, the multiplexer circuit may be configured to output at least one interpolated signal set associated with at least one of the interpolation filters. In general, the data parallelism after the n-th interpolation filter is $2^n$ times the data parallelism of the digital input signal set. Thus, a plurality of interpolated signal sets is provided. The multiplexer circuit may selectively receive and output the appropriate one of the interpolated signal sets based on requirements of an electronic component downstream of the digital data rate enhancement filter, for example based on the requirements of a trigger circuit.

Embodiments of the present disclosure further provide a digital data rate reduction filter. In an embodiment, the digital data rate reduction filter comprises a reduction filter input, a first decimation filter, a second decimation filter, and a multiplexer circuit. The first decimation filter is connected to the reduction filter input downstream of the reduction filter input. The second decimation filter is connected to the first decimation filter downstream of the first decimation filter. The reduction filter input is configured to receive a digital input signal set, wherein the digital input signal set comprises at least one digital input signal. The first decimation filter is configured to receive the digital input signal set and to decimate the digital input signal set, thereby obtaining a first decimated signal set. The second decimation filter is configured to receive the first decimated signal set and to decimate the first interpolated signal set, thereby obtaining a second decimated signal set. The multiplexer circuit is configured to selectively receive the first decimated signal set and/or the second decimated signal set. The multiplexer circuit is configured to output the first decimated signal set and/or the second decimated signal set received.

Due to the decimation by the first decimation filter, the first decimated signal set has a reduced temporal resolution compared to the digital input signal set. In other words, the data rate associated with the first decimated signal set is lower than the data rate associated with the digital input signal set, for example by a factor of two.

Likewise, the second decimated signal set has a reduced temporal resolution compared to the first decimated signal set. In other words, the data rate associated with the second decimated signal set is lower than the data rate associated with the first decimated signal set, for example by a factor of two.

The multiplexer circuit may selectively receive and output the first decimated signal set and/or the second decimated signal set based on requirements of an electronic circuit downstream of the digital data rate reduction filter. In other words, the multiplexer circuit may be configured to receive and output the decimated signal set that meets the requirements of the electronic circuit downstream of the digital data rate reduction filter.

For example, a memory circuit of a digital oscilloscope may be connected to the digital data rate reduction filter downstream of the digital data rate reduction filter. Thus, the decimated signal having the appropriate temporal resolution may be outputted by the multiplexer circuit, such that the requirements of the memory circuit are met.

In general, a certain temporal resolution of a signal set corresponds to a certain bandwidth of the signal set. Thus, the temporal resolution determines the bandwidth as well as the necessary memory space in order to save the corresponding signal set in a memory.

The digital data rate reduction filter may reduce the temporal resolution, i.e., the data parallelism, such that a predefined amount of memory space, for example less memory, is required in order to save the digital output signal outputted by the multiplexer circuit in a memory of the memory circuit.

According to an aspect of the present disclosure, the digital input signal set is a k×j signal, wherein k is a number of channels and j is a data parallelism of the digital input signal set. Thus, k denotes the number of active channels, i.e., the number of signals that are processed in parallel upstream of the digital data rate reduction filter. Further, j denotes the number of data points per time interval, for example the number of data points per clock cycle. Accordingly, j denotes the number of data points of the respective signal that are processed in parallel (in each channel) upstream of the digital data rate reduction filter.

In general, k may be a power of 2, i.e., $k=2^{K_{in}}$, with $K_{in}$ being an integer that is greater than or equal to 0. In some embodiments, k may be equal to 1, 2, 4, or 8. However, k may also be an integer greater than 8.

In general, j may be a power of 2, i.e., $j=2^{J_{in}}$, with $J_{in}$ being an integer that is greater than or equal to 0. In some embodiments, j may be equal to 1, 2, 4, 8, 16, 32, 64, or 128. However, j may also be an integer greater than 128.

In some embodiments, the sum of the integers $K_{in}$ and $J_{in}$ may be constant. In other words, $K_{int}$ and $J_{int}$ may be subject to the constraint $K_{in}+J_{in}=C_{in}$, with $C_{in}$ being an integer and being constant.

According to another aspect of the present disclosure, a digital output signal set outputted by the multiplexer circuit is a l×m signal, wherein l is a number of channels and m is a data parallelism of the digital output signal set. Thus, l denotes the number of active channels, i.e., the number of signals that are processed in parallel downstream of the digital data rate reduction filter. Further, m denotes the number of data points per time interval, for example the number of data points per clock cycle. Accordingly, m denotes the number of data points of the respective signal that are processed in parallel (in each channel) downstream of the digital data rate reduction filter.

In general, l may be a power of 2, i.e., $l=2^{L_{out}}$, with $L_{out}$ being an integer that is greater than or equal to 0. In some embodiments, l may be equal to 1, 2, 4, or 8. However, l may also be an integer greater than 8.

In general, m may be a power of 2, i.e., $m=2^{M_{out}}$, with $M_{out}$ being an integer that is greater than or equal to 0. In some embodiments, m may be equal to 1, 2, 4, 8, 16, 32, 64, or 128. However, m may also be an integer greater than 128.

In some embodiments, the sum of the integers $L_{out}$ and $M_{out}$ may be constant. In other words, $L_{out}$ and $M_{out}$ may be subject to the constraint $L_{out}+M_{out}=C_{out}$, with $C_{out}$ being an integer and being constant.

In an embodiment of the present disclosure, the digital input signal set is a k×j signal, wherein k is a number of channels and j is a data parallelism of the digital input signal set. A digital output signal set outputted by the multiplexer circuit is a l×m signal, wherein l is a number of channels and m is a data parallelism of the digital output signal set, and wherein l is smaller than k and/or wherein m is smaller than j. In other words, the number of channels may be reduced, as the number of output channels l is smaller than the number of input channels k. Alternatively or additionally, the data parallelism of the at least one decimated signal set outputted by the multiplexer circuit is reduced compared to the digital input signal set, as the data parallelism j of the digital input signal set is greater than the data parallelism m of the at least one decimated signal set outputted by the multiplexer circuit.

If the decimated signal set outputted by the data rate reduction filter comprises less channels than required by a downstream electronic component (e.g. a memory circuit), the digital signals associated with the missing channels may be declared void and/or may be set to a predefined value, for example to 0.

However, this allows for choosing a channel with a higher bandwidth than would usually be possible if the operational modes of the upstream electronic circuit (e.g. acquisition circuit) and the downstream electronic circuit (e.g. memory circuit) were rigidly coupled.

In other words, the number of channels may be reduced in exchange for a signal bandwidth in the downstream electronic component that is higher than usually possible.

Accordingly, operational modes of electronic components upstream and downstream of the digital data rate reduction filter can be chosen independently of each other, as the digital data rate reduction filter may adapt the number of channels and/or the data parallelism appropriately.

In a further embodiment of the present disclosure, the digital data rate enhancement filter comprises N interpolation filters, wherein N is an integer greater than 2, and wherein the multiplexer circuit is configured to selectively receive at least one interpolated signal set associated with at least one of the interpolation filters. Accordingly, the multiplexer circuit may be configured to output at least one decimated signal set associated with at least one of the decimation filters. In general, the data parallelism after the n-th decimation filter is $2^{-n}$ times the data parallelism of the digital input signal set. Thus, a plurality of decimated signal sets is provided. The multiplexer circuit may selectively receive and output the appropriate one of the decimated signal sets based on requirements of an electronic component downstream of the digital data rate enhancement filter, for example based on the requirements of a memory circuit.

Embodiments of the present disclosure further provide a digital oscilloscope. The digital oscilloscope comprises at least two signal inputs, an acquisition circuit, a memory circuit, and a trigger circuit. The digital oscilloscope further comprises a digital data rate enhancement filter, such as one of the enhancement filters described above and/or a digital data rate reduction filter, such as one of the reduction filters described above.

In general, the digital data rate enhancement filter may be configured to enhance the data parallelism of a digital input signal in order to adapt the data parallelism of the digital input signal to requirements of electronic circuits of the digital oscilloscope downstream of the digital data rare enhancement filter, as already described above.

The digital data rate reduction filter may be configured to reduce the data parallelism of a digital input signal in order to adapt the data parallelism of the digital input signal to requirements of electronic circuits of the digital oscilloscope downstream of the digital data rare reduction filter, as already described above.

Regarding the further advantages and properties of the digital oscilloscope, reference is made to the explanations given above with respect to the digital data rate enhancement filter and/or the digital data rate reduction filter, which also hold for the digital oscilloscope and vice versa.

According to an aspect of the present disclosure, the digital data rate reduction filter is connected to the acquisition circuit downstream of the acquisition circuit. Thus, a digital output signal set of the acquisition circuit corresponds to the digital input signal set of the digital data rate reduction filter. Accordingly, the digital input signal set of the digital data rate reduction filter has a number of channels and a data parallelism that depend on the active operational mode of the acquisition circuit.

According to another aspect of the present disclosure, the digital data rate reduction filter is connected to the memory circuit upstream of the memory circuit. Thus, a digital output signal set of the digital data rate reduction filter corresponds to a digital input signal set of the memory circuit. Accordingly, the digital output signal set of the digital data rate reduction filter has a number of channels and a data parallelism that depend on the active operational mode of the memory circuit. More precisely, the digital data rate reduction filter may be configured to adapt the number of channels and/or the data parallelism of the digital input signal set based on the active operational mode of the memory circuit.

In an embodiment of the present disclosure, the digital data rate enhancement filter is connected to the memory circuit downstream of the memory circuit. Thus, a digital output signal set of the memory circuit corresponds to the digital input signal set of the digital data rate enhancement filter. Accordingly, the digital input signal set of the digital data rate reduction filter has a number of channels and a data parallelism that depend on the active operational mode of the memory circuit.

In a further embodiment of the present disclosure, the digital data rate enhancement filter is connected to the trigger circuit upstream of the trigger circuit. Thus, a digital output signal set of the digital data rate enhancement filter corresponds to a digital input signal set of the trigger circuit. Accordingly, the digital output signal set of the digital data rate enhancement filter has a number of channels and a data parallelism that depend on the active operational mode of the trigger circuit. More precisely, the digital data rate enhancement filter may be configured to adapt the number of channels and/or the data parallelism of the digital input signal set based on the active operational mode of the trigger circuit.

According to a further aspect of the present disclosure, the acquisition circuit, the memory circuit, and the trigger circuit each have different operational modes, wherein different operational modes are associated with different numbers of channels and/or with different data parallelism. Thus, the acquisition circuit may have at least two acquisition circuit modes, wherein the at least two acquisition circuit modes differ in the number of channels and/or in the data parallelism. The memory circuit may have at least two memory circuit modes, wherein the at least two memory circuit modes differ in the number of channels and/or in the data parallelism. The trigger circuit may have at least two trigger circuit modes, wherein the at least two trigger circuit modes differ in the number of channels and/or in the data parallelism.

In some embodiments, the operational modes of the acquisition circuit, the memory circuit, and the trigger circuit are settable independent of each other. Thus, the acquisition circuit mode can be set to a certain number of channels and/or to a certain data parallelism independent of the memory circuit mode and/or independent of the trigger circuit mode. Likewise, the memory circuit mode can be set to a certain number of channels and/or to a certain data parallelism independent of the acquisition circuit mode and/or independent of the trigger circuit mode. The trigger circuit mode can be set to a certain numbers of channels and/or to a certain data parallelism independent of the acquisition circuit mode and/or independent of the memory circuit mode.

Accordingly, the individual sub-circuits of the digital oscilloscope can be set flexibly and/or (substantially) independently of each other in order to account for a plurality of different application requirements. Thus, a highly versatile digital oscilloscope is provided.

The operational modes of the acquisition circuit, the memory circuit, and the trigger circuit may be settable independent of each other up to a constraint, according to which the number of channels associated with the memory circuit mode is equal to or smaller than the number of channels associated with the acquisition circuit mode, and according to which the number of channels associated with the memory circuit mode is equal to or greater than the number of channels associated with the trigger circuit mode.

In an embodiment of the present disclosure, the acquisition circuit comprises at least one analog-to-digital converter (ADC), wherein the at least one ADC is connected to the at least two signal inputs downstream of the at least two signal inputs. In general, the at least one ADC is configured to receive at least one analog input signal and to digitize the at least one analog input signal with a predefined sample rate, thereby obtaining at least one digital input signal having a predefined sample rate.

In some embodiments, the acquisition circuit may comprise a plurality of ADCs, wherein at least one ADC may be associated with each of the inputs of the digital oscilloscope, respectively.

Optionally, the plurality of ADCs may be configured for interleaved operation in order to enhance the sample rate.

According to an aspect of the present disclosure, the memory circuit comprises an acquisition memory. The acquisition memory is configured to save samples associated with the digital input signal set, for example for further processing and/or for displaying the samples on a display. The memory circuit mode determines the temporal resolution and thus the bandwidth and the necessary memory space for saving the samples in the memory.

According to another aspect of the present disclosure, the digital oscilloscope comprises up to eight signal inputs, each of the up to eight signal inputs being associated with a signal channel. However, it is to be understood that the digital oscilloscope may comprise any other number of signal inputs greater than or equal to two.

Embodiments of the present disclosure further provide a digital oscilloscope. In an embodiment, the digital oscilloscope comprises at least two signal inputs, an acquisition circuit, a memory circuit, a trigger circuit, a digital data rate enhancement filter, and a digital data rate reduction filter. The acquisition circuit has at least two different acquisition circuit modes. The memory circuit has at least two different memory circuit modes. The trigger circuit has at least two different trigger circuit modes. The different acquisition circuit modes, memory circuit modes, and trigger circuit modes are associated with different numbers of channels and/or with different data parallelism, respectively. The digital data rate reduction filter is configured to decimate a digital output signal set of the acquisition circuit based on an active acquisition circuit mode and based on an active memory circuit mode. The digital data rate enhancement filter is configured to interpolate a digital output signal set of the memory circuit based on an active memory circuit mode and based on an active trigger circuit mode. The active acquisition circuit mode, the active memory circuit mode and the active trigger circuit mode are settable independent of each other.

Regarding the further advantages and properties of the digital oscilloscope, reference is made to the explanations given above with respect to the digital data rate enhancement filter and/or the digital data rate reduction filter, which also hold for the digital oscilloscope and vice versa. Moreover, the explanations given above with respect to the digital oscilloscope also apply.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth above in connection with the appended drawings, where like numerals reference like elements, are intended as a description of various embodiments of the present disclosure and are not intended to represent the only embodiments. Each embodiment described in this disclosure is provided merely as an example or illustration and should not be construed as preferred or advantageous over other embodiments. The illustrative examples provided herein are not intended to be exhaustive or to limit the disclosure to the precise forms disclosed. Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

In the description provided below, specific details are set forth to provide a thorough understanding of exemplary embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

Throughout this specification, terms of art may be used. These terms are to take on their ordinary meaning in the art from which they come, unless specifically defined herein or the context of their use would clearly suggest otherwise.

Figure 1:
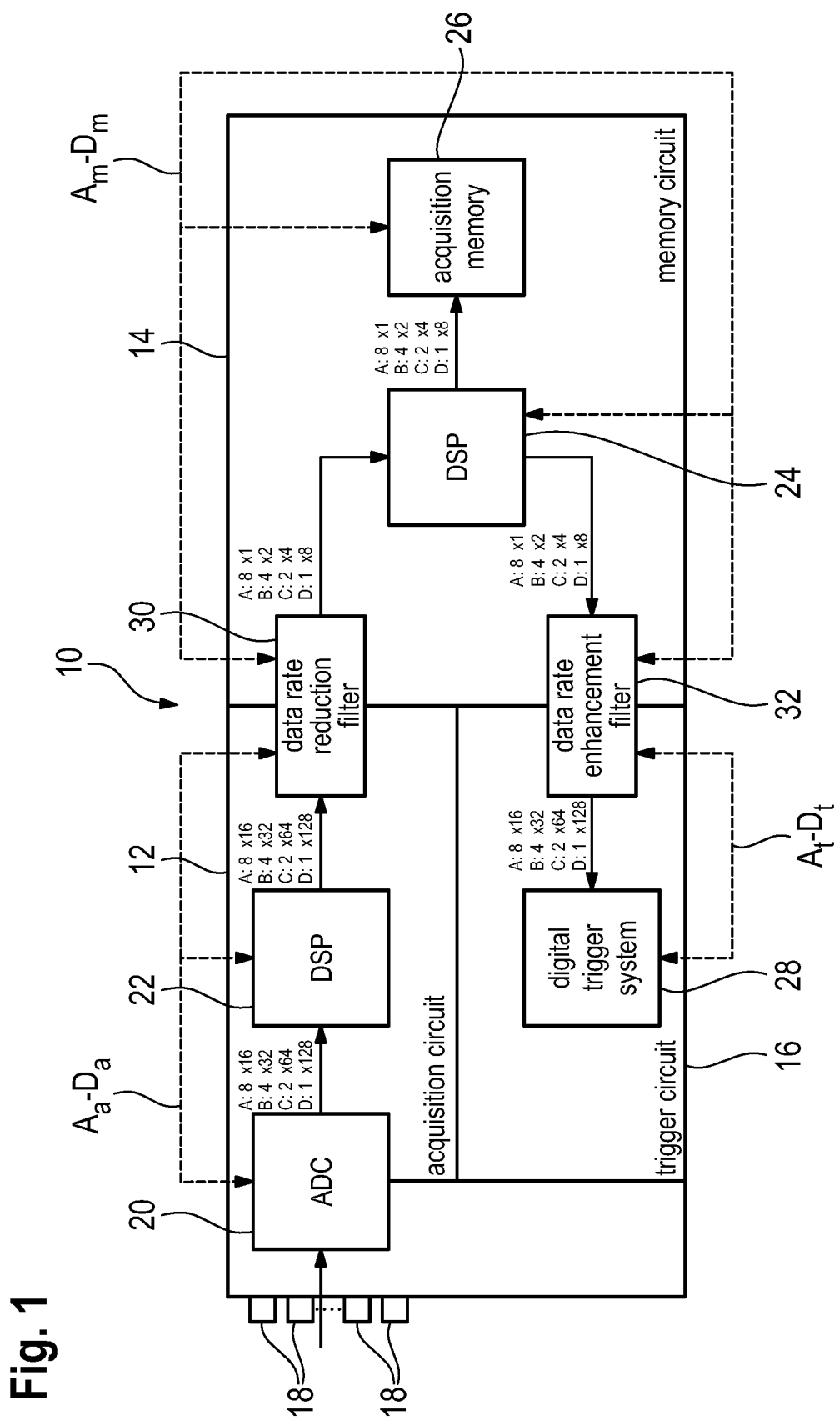
FIG. 1 schematically shows a digital oscilloscope according to an embodiment of the present disclosure.

FIG. 1 schematically shows a partial block diagram of a digital oscilloscope 10. As shown in FIG. 1, the digital oscilloscope 10 comprises an acquisition circuit 12, a memory circuit 14, a trigger circuit 16, and a predefined number of signal inputs 18.

The acquisition circuit 12 comprises at least one analog-to-digital converter (ADC) 20 that is connected to the signal inputs 18 downstream of the signal inputs 18. The acquisition circuit 12 further comprises a first digital signal processing circuit 22 that is connected to the at least one ADC 20 downstream of the at least one ADC 20. The acquisition circuit may comprise a plurality of ADCs 20, wherein at least one ADC 20 may be associated with each of the signal inputs 18 of the digital oscilloscope 10, respectively. Optionally, the plurality of ADCs 20 may be configured for interleaved operation in order to enhance the sample rate of the digital oscilloscope 10 at least in some operational modes.

The memory circuit 14 comprises a second digital signal processing circuit 24 and an acquisition memory 26, wherein the acquisition memory 26 is arranged downstream of the second digital signal processing circuit 24. The trigger circuit 16 comprises a digital trigger system 28 that is configured to detect predefined events in a signal supplied to the digital trigger system 28.

The memory circuit 14 and the acquisition circuit 12 are interconnected by a digital data rate reduction filter 30. More precisely, the digital data rate reduction filter 30 is connected to the first digital signal processing circuit 22 and to the second digital signal processing circuit 24.

The trigger circuit 16 and the memory circuit 14 are interconnected by a digital data rate enhancement filter 32. More precisely, the digital data rate enhancement filter 32 is connected to the second digital signal processing circuit 24 and to the digital trigger system 28.

The functionality of the digital oscilloscope 10 in general and of the individual components and sub-circuits of the digital oscilloscope 10 in particular are explained in the following using the example of an analog input signal set being processed by the digital oscilloscope 10, which is described in the following with reference to FIGS. 1-3.

An analog input signal set is received by the signal inputs 18, wherein the analog input signal set comprises at least one analog input signal to be analyzed by the digital oscilloscope 10, but may comprise a number of analog input signals up to the number of signal inputs 18.

Without restriction of generality, a representative embodiment is described in the following, according to which the digital oscilloscope 10 comprises eight signal inputs 18. Accordingly, the analog input signal set may comprise up to eight analog input signals.

The analog input signals are forwarded to the at least one ADC 20. The at least one ADC 20 digitizes the analog input signal set with a certain sampling rate, thereby generating a digital input signal set that comprises at least one digital input signal corresponding to at least one of the analog input signals. The digital input signal set is then processed by the first digital signal processing circuit 22.

The number of analog input signals digitized by the at least one ADC 20, i.e., the number of active channels of the acquisition circuit 12, and the sampling rate of the at least one ADC 20 depend on an operational mode of the acquisition circuit 12. In general, the sampling rate of the at least one ADC 20 corresponds to a clock rate of the at least one ADC 20 times a data parallelism in the respective acquisition circuit mode. For example, if the clock rate is 1 GHz and the data parallelism is 1, then the effective sampling rate of the at least one ADC 20 is 1 Gs/s. If the clock rate is 1 GHz and the data parallelism is 16, then the effective sampling rate of the at least one ADC 20 is 16 Gs/s.

Therein and in the following, the operational mode of the acquisition circuit 12 will be referred to as "acquisition circuit mode". Likewise, operational modes of the memory circuit 14 and of the trigger circuit 16 will be referred to as "memory circuit mode" and "trigger circuit mode", respectively.

In the representative embodiment shown in FIG. 1, the acquisition circuit 12 comprises four different acquisition circuit modes denoted by the letters $A_a$ to $D_a$. In a first acquisition circuit mode $A_a$, eight analog input signals are digitized with a data parallelism of 16, i.e., with 16 data points per clock cycle. Accordingly, the digital input signal set comprises eight digital input signals, each with a data parallelism of 16. Thus, each of the digital input signals may correspond to exactly one of the analog input signals.

In a second acquisition circuit mode $B_a$, four analog input signals are digitized with a data parallelism of 32, i.e., with 32 data points per clock cycle. Accordingly, the digital input signal set comprises four digital input signals, each with a data parallelism of 32. Thus, not of all of the analog input signals may be digitized. The four digital input signals may correspond to four predetermined ones of the analog input signals. For example, the four digital input signals may correspond to the analog input signals on the first four signal inputs 18.

Analogously, in a third acquisition circuit mode $C_a$, two analog input signals are digitized with a data parallelism of 64. In a fourth acquisition circuit mode $D_a$, one analog input signal is digitized with a data parallelism of 128.

In the following, the number of channels and the data parallelism of a digital signal set will be denoted in the form "k×j". Therein, k is an integer denoting the number of channels, i.e., the number of digital signals of the digital signal set. Moreover, j is an integer denoting the data parallelism of the respective digital signals of the digital signal set.

In the representative embodiment shown in FIG. 1, the memory circuit 14 comprises four memory circuit modes $A_m$ to $D_m$, which are associated with a 8×1 signal, a 4×2 signal, a 2×4 signal, and a 1×8 signal, respectively.

Further, the trigger circuit 16 comprises four trigger circuit modes $A_t$ to $D_t$, which are associated with a 8×16 signal, a 4×32 signal, a 2×64 signal, and a 1×128 signal, respectively.

In general, the data parallelism of a digital signal set processed by the digital oscilloscope 10 is reduced between the acquisition circuit 12 and the memory circuit 14 in order to reduce the memory space needed for saving the acquired data points (samples) in the acquisition memory 26. Moreover, the data parallelism of a digital signal set processed by the digital oscilloscope 10 is enhanced between the memory circuit 14 and the trigger circuit 16 in order to allow for more precise triggering due to the enhanced temporal resolution.

In FIG. 1, this general rule is reflected in the fact that the data parallelisms of the memory circuit modes $A_m$ to $D_m$ are smaller than the corresponding data parallelisms of the acquisition circuit modes $A_a$ to $D_a$, and smaller than the corresponding data parallelisms of the trigger circuit modes $A_t$ to $D_t$. For example, the data parallelism of the memory circuit mode $B_m$ is 2, while the data parallelism of the acquisition circuit mode $B_a$ is 32 and the data parallelism of the trigger circuit mode $B_t$ is 32.

The reduction of the data parallelism between the acquisition circuit 12 and the memory circuit 14 is performed by the data rate reduction filter 30, as is explained in the following with reference to FIG. 2. In an embodiment, the data rate reduction filter 30 comprises a reduction filter input 34, a plurality of decimation filters 36, a multiplexer circuit 38, and a reduction filter output 40.

The reduction filter input 34 is configured as an input interface that can be operated according to the (active) acquisition circuit mode. Accordingly, the reduction filter input 34 is configured to receive the digital input signal set from the first digital signal processing circuit 22, wherein the digital input signal set is a k×j signal, and wherein k and j depend on the active acquisition circuit mode.

In general, k may be a power of 2, i.e., $k=2^{K_{in}}$, with $K_{in}$ being an integer that is greater than or equal to 0. In some embodiments, k may be equal to 1, 2, 4, or 8. However, k may also be an integer greater than 8. In general, j may be a power of 2, i.e., $j=2^{J_{in}}$, with $J_{in}$ being an integer that is greater than or equal to 0. In some embodiments, j may be equal to 1, 2, 4, 8, 16, 32, 64, or 128. However, j may also be an integer greater than 128.

In some embodiments, the sum of the integers $K_{in}$ and $J_{in}$ may be constant. In other words, $K_{in}$ and $J_{in}$ may be subject to the constraint $K_{in}+J_{in}=C_{in}$, with $C_{in}$ being an integer and being constant.

Figure 2:
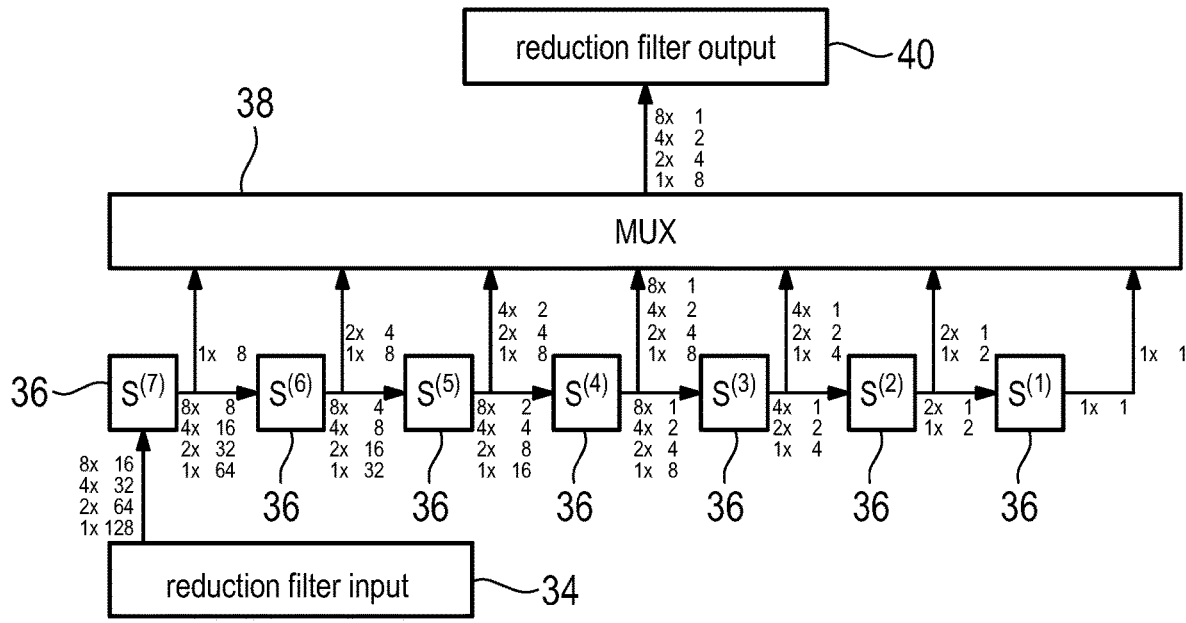
FIG. 2 schematically shows a digital data rate reduction filter according to an embodiment of the present disclosure.

The reduction filter input 34 forwards the digital input signal set to a first one of the decimation filters 36, which is denoted by $S^{(7)}$ in FIG. 2.

The first decimation filter 36 decimates the digital input signal set or rather the digital input signals associated with the digital input signal set, thereby generating a first decimated signal set, wherein the data parallelism of the first decimated signal set is reduced by a factor of 2 compared to the digital input signal set.

The first decimated signal set is forwarded to a second one of the decimation filters 36, which is denoted by $S^{(6)}$ in FIG. 2. The second decimation filter 36 decimates the first decimated signal set or rather the digital signals associated with the first decimated signal set, thereby generating a second decimated signal set, wherein the data parallelism of the second decimated signal set is reduced by a factor of 2 compared to the first decimated signal set.

In general, the decimation filters 36 consecutively decimate the digital input signal set or rather the digital input signals associated with the digital input signal set received by the reduction filter input 34.

With each decimation, the data parallelism of the digital input signal set is reduced by a factor of 2. Accordingly a decimated signal set outputted by the n-th decimation filter 36 has a data parallelism that corresponds to $2^{-n}$ times the data parallelism of the digital input signal set.

In each decimation step, the corresponding decimated signal set may be filtered by a low-pass filter in order to suppress alias effects.

The multiplexer circuit 38 is connected to the output of each of the decimation filters 36. The multiplexer circuit 38 selectively receives a decimated signal set outputted by one of the decimation filter 36 and forwards the received decimated signal set to the reduction filter output 40.

The reduction filter output 40 is configured as an output interface that can be operated according to the (active) memory circuit mode. Accordingly, the reduction filter output 40 is configured to output the decimated signal set received from the multiplexer circuit 38, wherein the decimated signal set is a l×m signal, and wherein m and l depend on the active memory circuit mode.

In general, l may be a power of 2, i.e., $l=2^{L_{out}}$, with $L_{out}$ being an integer that is greater than or equal to 0. In some embodiments, l may be equal to 1, 2, 4, or 8. However, l may also be an integer greater than 8. In general, m may be a power of 2, i.e., $m=2^{M_{out}}$, with $M_{out}$ being an integer that is greater than or equal to 0. In some embodiments, m may be equal to 1, 2, 4, 8, 16, 32, 64, or 128. However, m may also be an integer greater than 128. However, m is usually a number between 1 and 8 in the memory circuit 14.

In some embodiments, the sum of the integers $L_{out}$ and $M_{out}$ may be constant. In other words, $L_{out}$ and $M_{out}$ may be subject to the constraint $L_{out}+M_{out}=C_{out}$, with $C_{out}$ being an integer and being constant.

For the data rate reduction filter 30, l is smaller than or equal to k, i.e., the number of output channels is smaller than or equal to the number of input channels. Moreover, m is smaller than or equal to j, i.e., the data parallelism of the decimated signal set outputted by the data rate reduction filter 30 is smaller than or equal to the data parallelism of the digital input signal set.

If the decimated signal set outputted by the data rate reduction filter 30 comprises less channels than intended by the memory circuit mode, the digital signals associated with the missing channels may be declared void and/or may be set to a predefined value, for example to 0. This allows the acquisition circuit mode and the memory circuit mode to be chosen independently of each other, as the data rate reduction filter 30 automatically "translates" between the acquisition circuit mode and the memory circuit mode.

For example, if the acquisition circuit mode is $A_a$, then the memory circuit mode is not restricted to be $A_m$, but can be freely chosen from $A_m$ to $D_m$. Accordingly, instead of being restricted to a data parallelism of 1 in the memory circuit 14, a higher data parallelism can be chosen, such that the digital input signal set can be saved in the acquisition memory 26 with a higher bandwidth. Thus, the number of channels may be reduced in exchange for an increased signal bandwidth.

In some embodiments, the multiplexer circuit 38 selectively receives and outputs the appropriate decimated signal set, such that the requirements of the memory circuit mode with respect to the number of channels and/or the data parallelism are met. The decimated signal set outputted by the data rate reduction filter 30 is processed by the second digital signal processing circuit 24 and may be saved in the acquisition memory 26.

For example, the decimated signal set may be filtered by an FIR filter and/or may be decimated further. The decimated signal set processed by the second digital signal processing circuit 24 is forwarded to the data rate enhancement filter 32

The data rate enhancement filter 32 enhances the data rate of the digital signal set received from the second digital signal processing circuit 24, as is explained in the following with reference to FIG. 3. In an embodiment, the data rate enhancement filter 32 comprises an enhancement filter input 42, a plurality of interpolation filters 44, a multiplexer circuit 46, and an enhancement filter output 40.

The enhancement filter input 42 is configured as an input interface that can be operated according to the memory circuit mode. Accordingly, the enhancement filter input 42 is configured to receive the digital signal set from the second digital signal processing circuit 24, wherein the digital signal set is a k×j signal, and wherein k and j depend on the active memory circuit mode.

In general, k may be a power of 2, i.e., $k=2^{K_{in}}$, with $K_{in}$ being an integer that is greater than or equal to 0. In some embodiments, k may be equal to 1, 2, 4, or 8. However, k may also be an integer greater than 8. In general, j may be a power of 2, i.e., $j=2^{J_{in}}$, with $J_{in}$ being an integer that is greater than or equal to 0. In some embodiments, j may be equal to 1, 2, 4, 8, 16, 32, 64, or 128. However, j is usually a number between 1 and 8 in the memory circuit 14.

In some embodiments, the sum of the integers $K_{in}$ and $J_{in}$ may be constant. In other words, $K_{in}$ and $J_{in}$ may be subject to the constraint $K_{in}+J_{in}=C_{in}$, with $C_{in}$ being an integer and being constant.

Figure 3:
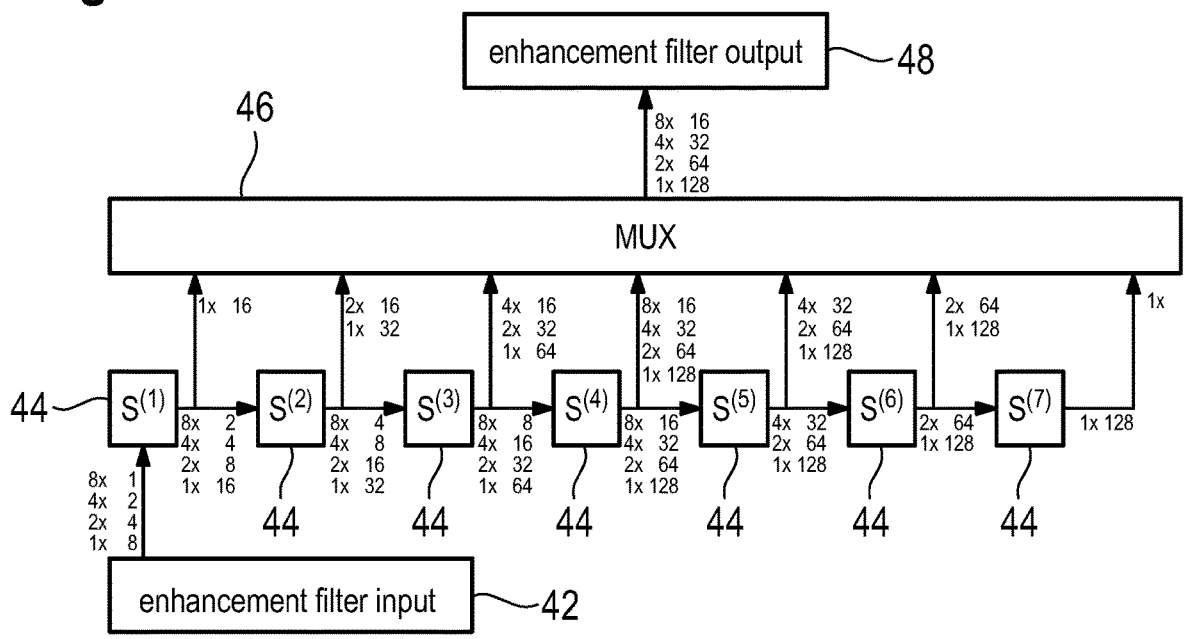
FIG. 3 schematically shows a digital data rate reduction filter according to an embodiment of the present disclosure.

The enhancement filter input 42 forwards the digital input signal set to a first one of the interpolation filters 44, which is denoted by $S^{(1)}$ in FIG. 3. The first interpolation filter 44 interpolates the digital signal set or rather the digital input signals associated with the digital signal set, thereby generating a first interpolated signal set, wherein the data parallelism of the first interpolated signal set is increased by a factor of 2 compared to the digital signal set received from the second digital signal processing circuit 24.

The first interpolated signal set is forwarded to a second one of the interpolation filters 44, which is denoted by $S^{(2)}$ in FIG. 3. The second interpolation filter 44 interpolates the first interpolated signal set or rather the digital signals associated with the first interpolated signal set, thereby generating a second interpolated signal set, wherein the data parallelism of the second interpolated signal set is increased by a factor of 2 compared to the first interpolated signal set.

The interpolation filters 44 consecutively decimate the digital signal set or rather the digital signals associated with the digital signal set received by the enhancement filter input 42.

With each interpolation, the data parallelism of the digital signal set is increased by a factor of 2. Accordingly an interpolated signal set outputted by the n-th interpolation filter 44 has a data parallelism that corresponds to $2^n$ times the data parallelism of the digital signal set received from the second digital signal processing circuit 24.

In each interpolation step, the corresponding decimated signal set may be filtered by a low-pass filter in order to suppress alias effects.

The multiplexer circuit 46 is connected to the output of each of the interpolation filters 44. The multiplexer circuit 46 selectively receives an interpolated signal set outputted by one of the interpolation filter 44 and forwards the received interpolated signal set to the enhancement filter output 48.

The enhancement filter output 48 is configured as an output interface that can be operated according to the active trigger circuit mode. Accordingly, the enhancement filter output 48 is configured to output the interpolated signal set received from the multiplexer circuit 46, wherein the interpolated signal set is a l×m signal, and wherein m and l depend on the active trigger circuit mode.

In general, l may be a power of 2, i.e., $l=2^{L_{out}}$, with $L_{out}$ being an integer that is greater than or equal to 0. In some embodiments, l may be equal to 1, 2, 4, or 8. However, l may also be an integer greater than 8. In general, m may be a power of 2, i.e., $m=2^{M_{out}}$, with $M_{out}$ being an integer that is greater than or equal to 0. In some embodiments, m may be equal to 1, 2, 4, 8, 16, 32, 64, or 128. However, m may also be an integer greater than 128.

In some embodiments, the sum of the integers $L_{out}$ and $M_{out}$ may be constant. In other words, $L_{out}$ and $M_{out}$ may be subject to the constraint $L_{out}+M_{out}=C_{out}$, with $C_{out}$ being an integer and being constant.

For the data rate enhancement filter 32, l is smaller than or equal to k, i.e., the number of output channels is smaller than or equal to the number of input channels. Moreover, m is greater than or equal to j, i.e., the data parallelism of the interpolated signal set outputted by the data rate enhancement filter 32 is greater than or equal to the data parallelism of the digital signal set received from the second digital signal processing circuit 24.

If the interpolated signal set outputted by the data rate enhancement filter 32 comprises less channels than intended by the trigger circuit mode, the digital signals associated with the missing channels may be declared void and/or may be set to a predefined value, for example to 0. Accordingly, the number of channels may be reduced in exchange for increased data parallelism.

Moreover, the memory circuit mode and the trigger circuit mode can be chosen independently of each other, as the data rate enhancement filter 32 automatically "translates" between the memory circuit mode and the trigger circuit mode. More precisely, the multiplexer circuit 46 selectively receives and outputs the appropriate interpolated signal set, such that the requirements of the trigger circuit mode with respect to the number of channels and/or the data parallelism are met.

The interpolated signal set outputted by the data rate enhancement filter 32 is processed by the digital trigger system 28. In general, the digital trigger system 28 is configured to detect predefined events in the interpolated signal set outputted by the data rate enhancement filter.

Thus, a high temporal resolution (i.e., a high data parallelism) of the interpolated signal set is advantageous if high precision is required.

Summarizing, a highly versatile digital oscilloscope 10 is provided, as the acquisition circuit mode, the memory circuit mode, and the trigger circuit mode can be chosen independent of each other. This enables, for example, that a digital signal set processed by the digital oscilloscope 10 is saved in the acquisition memory 26 with a wanted bandwidth, i.e., for example with high or low data parallelism, while still maintaining the ability to perform precise digital triggering with high data parallelism in the digital trigger system 28.

While the digital data rate reduction filter 30 and the digital data rate enhancement filter 32 are described in the context of the digital oscilloscope 10, it is to be understood that the digital data rate reduction filter 30 and the digital data rate enhancement filter 32 can also be used in other electronic components and/or other measurement instruments, for example in spectrum analyzers.

Certain embodiments disclosed herein utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A digital data rate enhancement filter, the digital data rate enhancement filter comprising an enhancement filter input, a first interpolation filter, a second interpolation filter, and a multiplexer circuit,
   wherein the first interpolation filter is connected to the enhancement filter input downstream of the enhancement filter input,
   wherein the second interpolation filter is connected to the first interpolation filter downstream of the first interpolation filter,
   wherein the enhancement filter input is configured to receive a digital input signal set,
   wherein the digital input signal set comprises at least one digital input signal,
   wherein the first interpolation filter is configured to receive the digital input signal set and to interpolate the digital input signal set, thereby obtaining a first interpolated signal set,
   wherein the second interpolation filter is configured to receive the first interpolated signal set and to interpolate the first interpolated signal set, thereby obtaining a second interpolated signal set,
   wherein the multiplexer circuit is configured to selectively receive at least one of the first interpolated signal set and the second interpolated signal set, and
   wherein the multiplexer circuit is configured to output at least one of the first interpolated signal set and the second interpolated signal set received.

2. The digital data rate enhancement filter of claim 1, wherein the digital input signal set is a k×j signal, wherein k is a number of channels and j is a data parallelism of the digital input signal set.

3. The digital data rate enhancement filter of claim 2, wherein a digital output signal set outputted by the multiplexer circuit is a l×m signal, wherein l is a number of channels and m is a data parallelism of the digital output signal set, and wherein l is smaller than k and/or wherein m is greater than j.

4. The digital data rate enhancement filter of claim 1, wherein a digital output signal set outputted by the multiplexer circuit is a l×m signal, wherein l is a number of channels and m is a data parallelism of the digital output signal set.

5. The digital data rate enhancement filter of claim 1, wherein the digital data rate enhancement filter comprises N interpolation filters, wherein N is an integer greater than 2, and wherein the multiplexer circuit is configured to selectively receive at least one interpolated signal set associated with at least one of the interpolation filters.

6. A digital data rate reduction filter, the digital data rate reduction filter comprising a reduction filter input, a first decimation filter, a second decimation filter, and a multiplexer circuit,
wherein the first decimation filter is connected to the reduction filter input downstream of the reduction filter input,
wherein the second decimation filter is connected to the first decimation filter downstream of the first decimation filter,
wherein the reduction filter input is configured to receive a digital input signal set, wherein the digital input signal set comprises at least one digital input signal,
wherein the first decimation filter is configured to receive the digital input signal set and to decimate the digital input signal set, thereby obtaining a first decimated signal set,
wherein the second decimation filter is configured to receive the first decimated signal set and to decimate the first decimated signal set, thereby obtaining a second decimated signal set,
wherein the multiplexer circuit is configured to selectively receive at least one of the first decimated signal set and the second decimated signal set, and
wherein the multiplexer circuit is configured to output at least one of the first decimated signal set and the second decimated signal set received.

7. The digital data rate reduction filter of claim 6, wherein the digital input signal set is a k×j signal, wherein k is a number of channels and j is a data parallelism of the digital input signal set.

8. The digital data rate enhancement filter of claim 7, wherein a digital output signal set outputted by the multiplexer circuit is a l×m signal, wherein l is a number of channels and m is a data parallelism of the digital output signal set, and wherein l is smaller than k and/or wherein m is smaller than j.

9. The digital data rate enhancement filter of claim 6, wherein a digital output signal set outputted by the multiplexer circuit is a l×m signal, wherein l is a number of channels and m is a data parallelism of the digital output signal set.

10. The digital data rate enhancement filter of claim 6, wherein the digital data rate enhancement filter comprises N interpolation filters, wherein N is an integer greater than 2, and wherein the multiplexer circuit is configured to selectively receive at least one interpolated signal set associated with at least one of the interpolation filters.

11. A digital oscilloscope, comprising at least two signal inputs, an acquisition circuit, a memory circuit, and a trigger circuit,
wherein the digital oscilloscope includes at least one of:
(a) a digital data rate enhancement filter, the digital data rate enhancement filter comprising an enhancement filter input, a first interpolation filter, a second interpolation filter, and a multiplexer circuit,
wherein the first interpolation filter is connected to the enhancement filter input downstream of the enhancement filter input,
wherein the second interpolation filter is connected to the first interpolation filter downstream of the first interpolation filter,
wherein the enhancement filter input is configured to receive a digital input signal set,
wherein the digital input signal set comprises at least one digital input signal,
wherein the first interpolation filter is configured to receive the digital input signal set and to interpolate the digital input signal set, thereby obtaining a first interpolated signal set,
wherein the second interpolation filter is configured to receive the first interpolated signal set and to interpolate the first interpolated signal set, thereby obtaining a second interpolated signal set,
wherein the multiplexer circuit is configured to selectively receive at least one of the first interpolated signal set and the second interpolated signal set, and
wherein the multiplexer circuit is configured to output at least one of the first interpolated signal set and the second interpolated signal set received, or
(b) a digital data rate reduction filter, the digital data rate reduction filter comprising a reduction filter input, a first decimation filter, a second decimation filter, and a multiplexer circuit,
wherein the first decimation filter is connected to the reduction filter input downstream of the reduction filter input,
wherein the second decimation filter is connected to the first decimation filter downstream of the first decimation filter,
wherein the reduction filter input is configured to receive a digital input signal set, wherein the digital input signal set comprises at least one digital input signal,
wherein the first decimation filter is configured to receive the digital input signal set and to decimate the digital input signal set, thereby obtaining a first decimated signal set,
wherein the second decimation filter is configured to receive the first decimated signal set and to decimate the first decimated signal set, thereby obtaining a second decimated signal set,
wherein the multiplexer circuit is configured to selectively receive at least one of the first decimated signal set and the second decimated signal set, and
wherein the multiplexer circuit is configured to output at least one of the first decimated signal set and the second decimated signal set received.

12. The digital oscilloscope of claim 11, wherein the digital data rate reduction filter is connected to the acquisition circuit downstream of the acquisition circuit.

13. The digital oscilloscope of claim 11, wherein the digital data rate reduction filter is connected to the memory circuit upstream of the memory circuit.

14. The digital oscilloscope of claim 11, wherein the digital data rate enhancement filter is connected to the memory circuit downstream of the memory circuit.

15. The digital oscilloscope of claim 11, wherein the digital data rate enhancement filter is connected to the trigger circuit upstream of the trigger circuit.

16. The digital oscilloscope of claim 11, wherein the acquisition circuit, the memory circuit, and the trigger circuit each have different operational modes, wherein different operational modes are associated with different numbers of channels and/or with different data parallelism.

17. The digital oscilloscope of claim 16, wherein the operational modes of the acquisition circuit, the memory circuit, and the trigger circuit are settable independent of each other.

18. The digital oscilloscope of claim 11, wherein the acquisition circuit comprises at least one analog-to-digital converter, wherein the at least one analog-to-digital converter is connected to the at least two signal inputs downstream of the at least two signal inputs.

19. The digital oscilloscope of claim 11, wherein the memory circuit comprises an acquisition memory.

20. The digital oscilloscope of claim 11, wherein the digital oscilloscope comprises up to eight signal inputs, each of the up to eight signal inputs being associated with a signal channel.

21. A digital oscilloscope, comprising at least two signal inputs, an acquisition circuit, a memory circuit, a trigger circuit, a digital data rate enhancement filter, and a digital data rate reduction filter,
- wherein the acquisition circuit has at least two different acquisition circuit modes, wherein the memory circuit has at least two different memory circuit modes, and wherein the trigger circuit has at least two different trigger circuit modes,
- wherein different acquisition circuit modes, memory circuit modes, and trigger circuit modes are associated with different numbers of channels and/or with different data parallelism, respectively
- wherein the digital data rate reduction filter is configured to decimate a digital output signal of the acquisition circuit based on an active acquisition circuit mode and based on an active memory circuit mode,
- and wherein the digital data rate enhancement filter is configured to interpolate a digital output signal of the memory circuit based on an active memory circuit mode and based on an active trigger circuit mode, and
- wherein the active acquisition circuit mode, the active memory circuit mode and the active trigger circuit mode are settable independent of each other.

* * * * *